United States Patent [19]
Canestri et al.

[11] Patent Number: 5,272,558
[45] Date of Patent: Dec. 21, 1993

[54] TWO LEVEL FIBER OPTIC COMMUNICATION FROM THREE-VALUE ELECTRONIC SIGNAL SOURCE

[75] Inventors: Michael L. Canestri, Wallingford; Ross D. Capen, Newtown; Kevin F. Keefe, Milford, all of Conn.

[73] Assignee: Lightwave Communications, Inc., Milford, Conn.

[21] Appl. No.: 824,586

[22] Filed: Jan. 23, 1992

Related U.S. Application Data

[63] Continuation-in-part of Ser. No. 538,224, Jun. 14, 1990, abandoned.

[51] Int. Cl.$^5$ ............... H04B 10/12; H04B 10/00; H04J 15/00; H04L 5/14
[52] U.S. Cl. ................... 359/173; 359/118; 359/143; 359/152; 359/184; 370/32; 375/55; 455/78
[58] Field of Search ............ 359/152, 173, 179, 118, 359/110, 181, 188, 184-186, 143, 164; 375/114, 55; 370/92, 32, 99, 87; 340/825.04; 358/435; 455/78

[56] References Cited

U.S. PATENT DOCUMENTS

| | | | |
|---|---|---|---|
| 3,914,537 | 10/1975 | Perreau et al. | 358/435 |
| 4,000,371 | 12/1976 | Ogawa | 358/435 |
| 4,399,563 | 8/1983 | Greenberg | 359/167 |
| 4,654,844 | 3/1987 | Mandello | 359/181 |
| 4,718,118 | 1/1988 | Viola | 359/180 |
| 4,850,046 | 7/1989 | Philippe | 359/184 |

Primary Examiner—Richard E. Chilcot, Jr.
Assistant Examiner—K. Negash
Attorney, Agent, or Firm—Ware, Fressola, Van Der Sluys & Adolphson

[57] ABSTRACT

A fiber optic extender system in which messages are transferred by fiber optic lines between remotely located electronic units. The electronic units (e.g., transformer-isolated) have three signal levels: positive voltage, negative voltage, and zero voltage. Because the fiber optic system can conveniently handle only two signal levels—on and off—potentially serious communication problems are avoided by generating and transmitting a short end-of-message pulse whenever the transmitting electronic unit is at zero voltage level. This end-of-message pulse is detected at the remote electronic unit, and the line is cleared for the next message.

10 Claims, 9 Drawing Sheets

BUS EXTENDER
(PRIOR ART)

BUS EXTENDER (PRIOR ART)

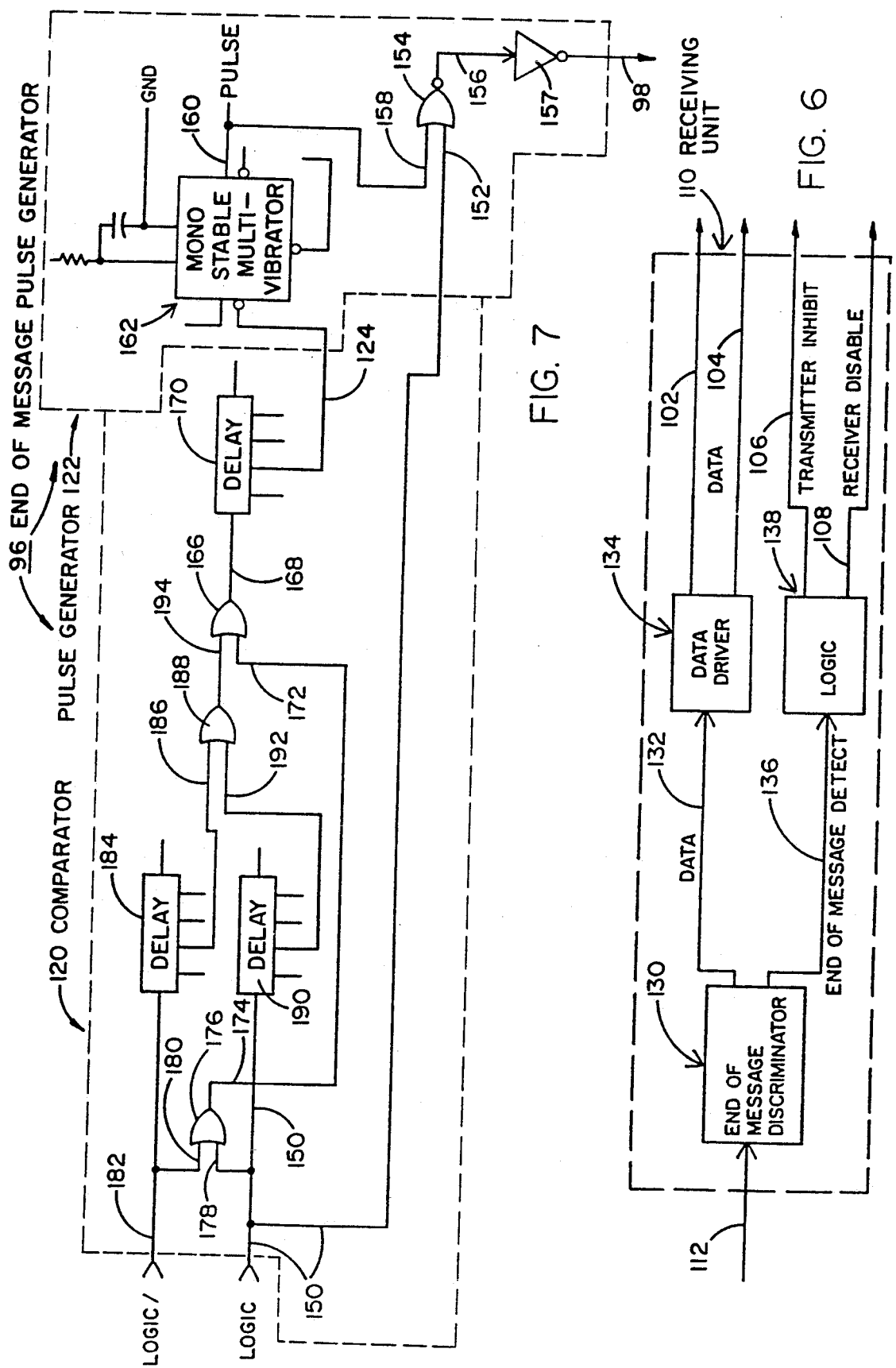

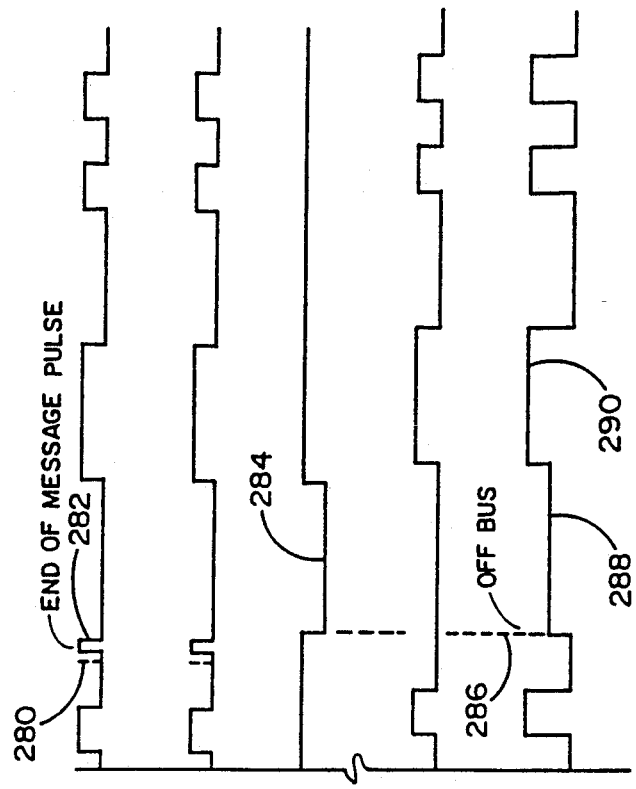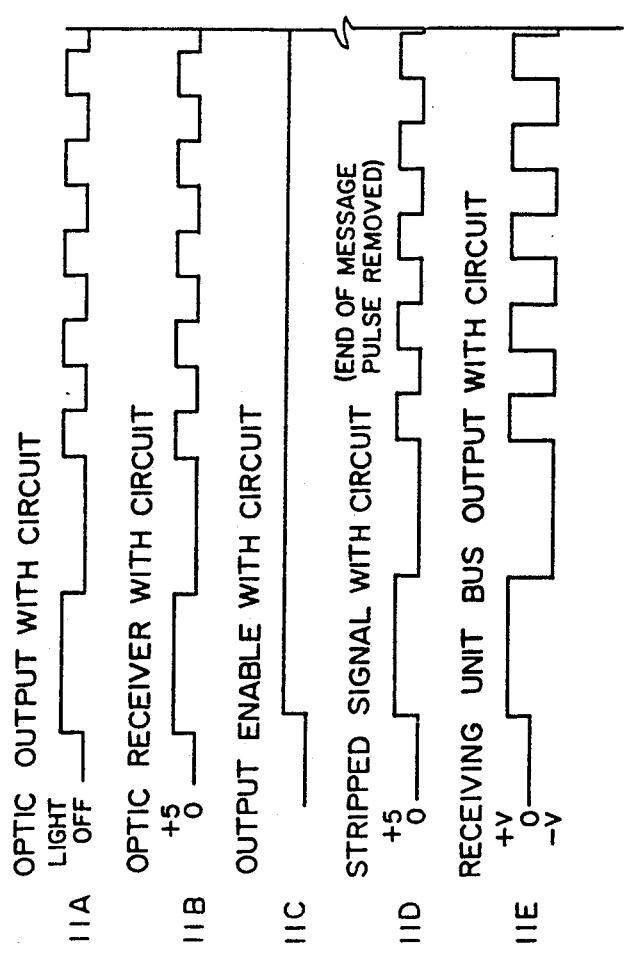
FIG. 11

TWO LEVEL FIBER OPTIC COMMUNICATION FROM THREE-VALUE ELECTRONIC SIGNAL SOURCE

This application is a continuation-in-part of application Ser. No. 07/538,224, filed Jun. 14, 1990 now abandoned.

BACKGROUND OF THE INVENTION

This invention relates to the use of optical fibers for transmission of electronic signals which have three levels. The problem leading to the present invention arose from the desire to provide a fiber optic bus extender suitable for use with the military standard data bus MIL-STD-1553, and similar data transmission systems.

Fiber optic lines have major advantages as carriers of optical signals derived from electronic signals on a data bus. Such electronic signals may, for example, be those in aircraft internal time division command/response multiplex data buses utilized in systems integration of aircraft subsystems. It is often desirable or necessary to transmit signals from a data bus to a remote location. Electrical wiring can be used, but the long lines are subject to noise and other transmission limitations.

A fiber optic bus extender will permit bus information to be optically transmitted to, and received from, a remote location, e.g., a location 500 meters or 1,000 meters from the bus. A fiber optic extender is able to protect the transmitted signals from noise interference, in addition to its other advantages over electrical cable connections. A fiber optic extender preferably has two lines, one carrying signals from a bus-connected transmitter, and the other carrying signals to a bus-connected receiver. At the other end of the extender, there may be a monitor, a remote terminal, a bus controller, or another bus.

A fiber optic extender, when used instead of an electrical cable extender, has a significant problem in working with standard bus data systems. This problem results from the fact that bus data having three signal levels must be transmitted by an optical cable which can only carry two signal levels. FIG. 3 of this application is a time diagram which illustrates the difficulties caused by this problem. Solution of the problem is the objective of the present invention.

The difficulties result from the fact that the remotely located unit to which the bus extender carries data must be promptly informed when a given message on the bus has terminated. The transmission system must be cleared promptly for the next message. However, the bus messages have no end-of-message signal which can be carried by a fiber optic extender. Use of an added fiber connection or an added signal frequency to solve the problem would make the system more cumbersome and significantly more expensive. Such systems would also have an increased likelihood of failure.

Over approximately 18 months, various possible solutions, including an unsuccessful system discussed below, were considered and tried for the purpose of avoiding the bus extender difficulties described above, which had the effect of causing loss of bus synchronization. These efforts led to the successful signal transmission system described and claimed in this application.

SUMMARY OF THE INVENTION

The present invention effectively deals with the problem of combining a three level bus terminal signal with an optical system which carries only two levels. In the Mil-Std-1553 bus standard, a digital "one" is represented as a positive voltage, a digital "zero" is represented as a negative voltage, and zero voltage is used to indicate the end of a given message. The present invention is designed to efficiently transmit this third "end-of-message" signal level.

The present invention provides (a) an electronic means at the transmitter for detecting the end of a given message and sending on the fiber optic extender an end-of-message signal and (b) an electronic means at the receiver for detecting the end-of-message signal and enabling the receiver to accept another message.

When the end of message detection occurs at the transmitter, a supervisory pulse is sent out, whose width is less than any other pulse in the data on the bus. This is, in effect, a "violation" of the bus protocol. As such, it cannot be confused with any other signal.

BRIEF DESCRIPTION OF THE DRAWINGS

FIGS. 4-9 disclose the details of the present invention. FIG. 4 is a block diagram showing electronic circuitry which handles an end-of-message pulse;

FIG. 5 is a block diagram showing the transmitter of the end-of-message pulse;

FIG. 6 is a block diagram showing the receiver of the end-of-message pulse;

FIG. 7 provides a more detailed showing of the electronic elements which create the end-of-message pulse at the transmitter end;

FIG. 8 is a time diagram showing the pulsing sequences at various positions in the circuitry of FIG. 7;

FIG. 9 provides a more detailed showing of the electronic elements which detect the end-of-message pulse at the receiver end; and FIGS. 10 and 11 are time diagrams showing the pulsing sequences in the old design and new design bus extender systems, respectively.

DETAILED DESCRIPTION OF SPECIFIC EMBODIMENTS

Figure 1:
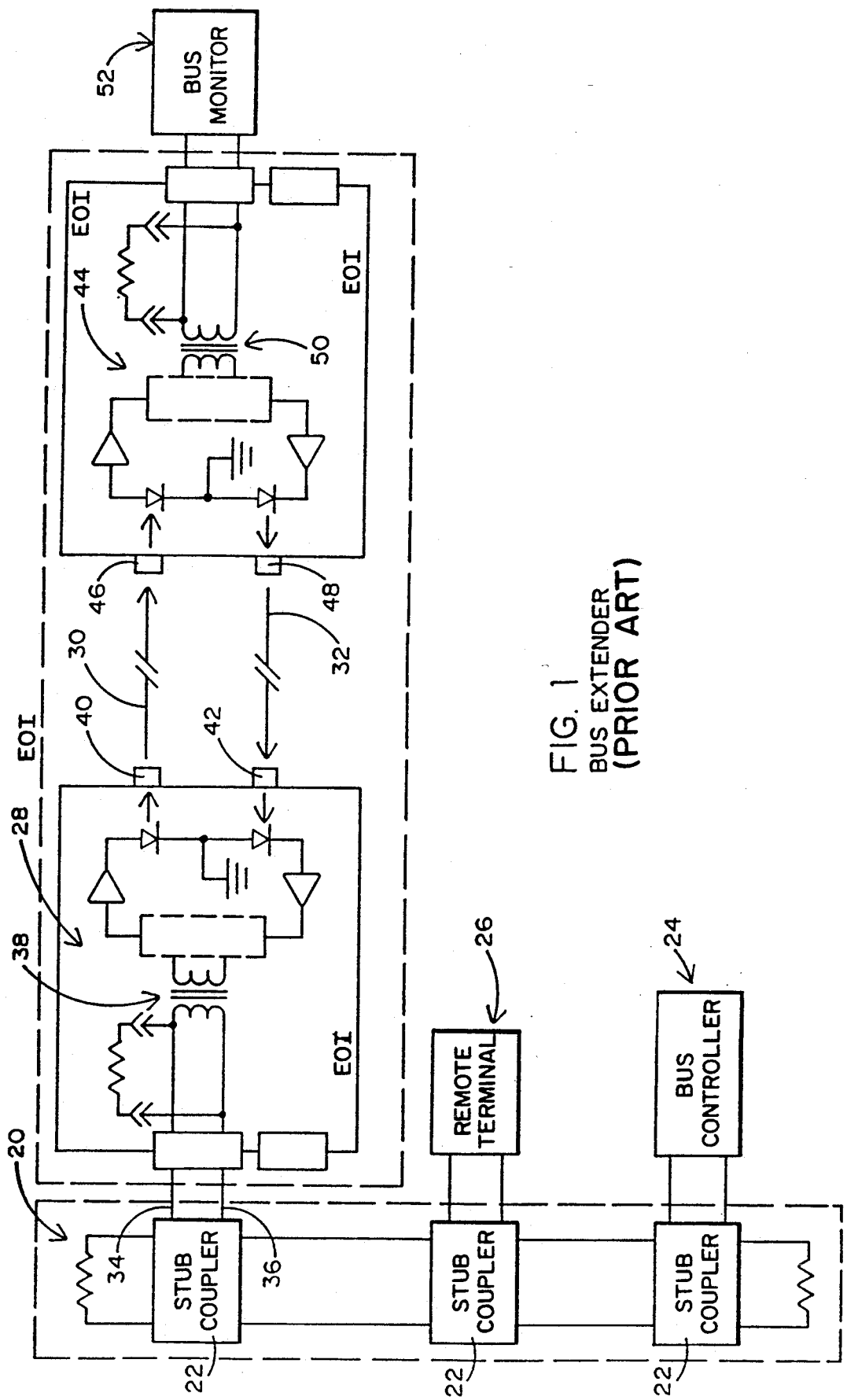
FIG. 1 is a diagram of a complete bus and extender system, including two bus-to-extender terminals.

FIG. 1 illustrates a system utilizing a bus extender. A bus 20, which may conform to the Mil-Std-1553 standard, is shown containing three stub couplers 22. One coupler 22 is connected to a bus controller 24, and another coupler 22 is connected to a remote terminal 26.

A third coupler 22 is connected by a bus extender to a remotely located bus monitor 52. If the bus extender were provided by electrical cable, no special problem would exist, because the electrical cable could transmit the three level data between bus 20 and monitor 52. However, as stated above, bus extenders using electrical cable are often impractical because of the noise problem and the limitations on efficiency caused by distance. These limitations include the buildup of resistance, capacitance and inductance in a long electrical cable connection.

Because of the deficiencies of electrical cable as a bus extender, it is desired to substitute optical fiber. In a fiber optic bus extender system, one of the couplers 22 would be connected to a unit 28 which connects the bus to duplex fiber optic cables 30 and 32. Unit 28 is an electrical/optical interface (EOI) unit. It has wire connections 34 and 36 with coupler 22. The conversion of electrical signals to optical signals, and vice versa, in unit 28 is accomplished by circuitry which includes a transformer 38. The EOI unit 28 has a transmitter terminal 40 and a receiver terminal 42.

A similar second electrical/optical interface (EOI) unit 44 is at a remote location from EOI unit 28, and is connected to the other ends of fiber optic cables 30 and 32. A receiver terminal 46 on EOI unit 44 is connected by cable 30 to the transmitter terminal 40 o EOI unit 28. And a transmitter terminal 48 on EOI unit 44 is connected by cable 32 to the receiver terminal 42 on EOI unit 28. EOI unit 44, like EOI unit 28, has electrical circuitry for conversion of electrical signals to optical signals, and vice versa.

EOI unit 44 includes a transformer 50. The transformers 38 and 50 in the respective EOI units 28 and 44 provide protection from short circuiting for the portions of the system to which they connect. The transformers are bipolar devices, i.e., they output positive-going and negative-going pulses, depending on the instantaneous circuit polarization. Any such bi-polar devices have, in effect, three output values—positive voltage, negative voltage, and zero voltage.

A pulse of light in a fiber optic cable is transmitted when the output of unit 28 or 44 is positive, and no light is transmitted when the output is zero or negative. In other words, there are three signal values at the transformer, but only two signal conditions (on and off) can be carried by the fiber optic cable. The signal transmission system comprises the bus portion having three signal values, an electronic logic portion in which two levels (1 and 0) are used, and an optical portion in which two levels (on and off) are used. The electronic logic portion is the link between the bus and the fiber optic bus extender.

Figure 2:
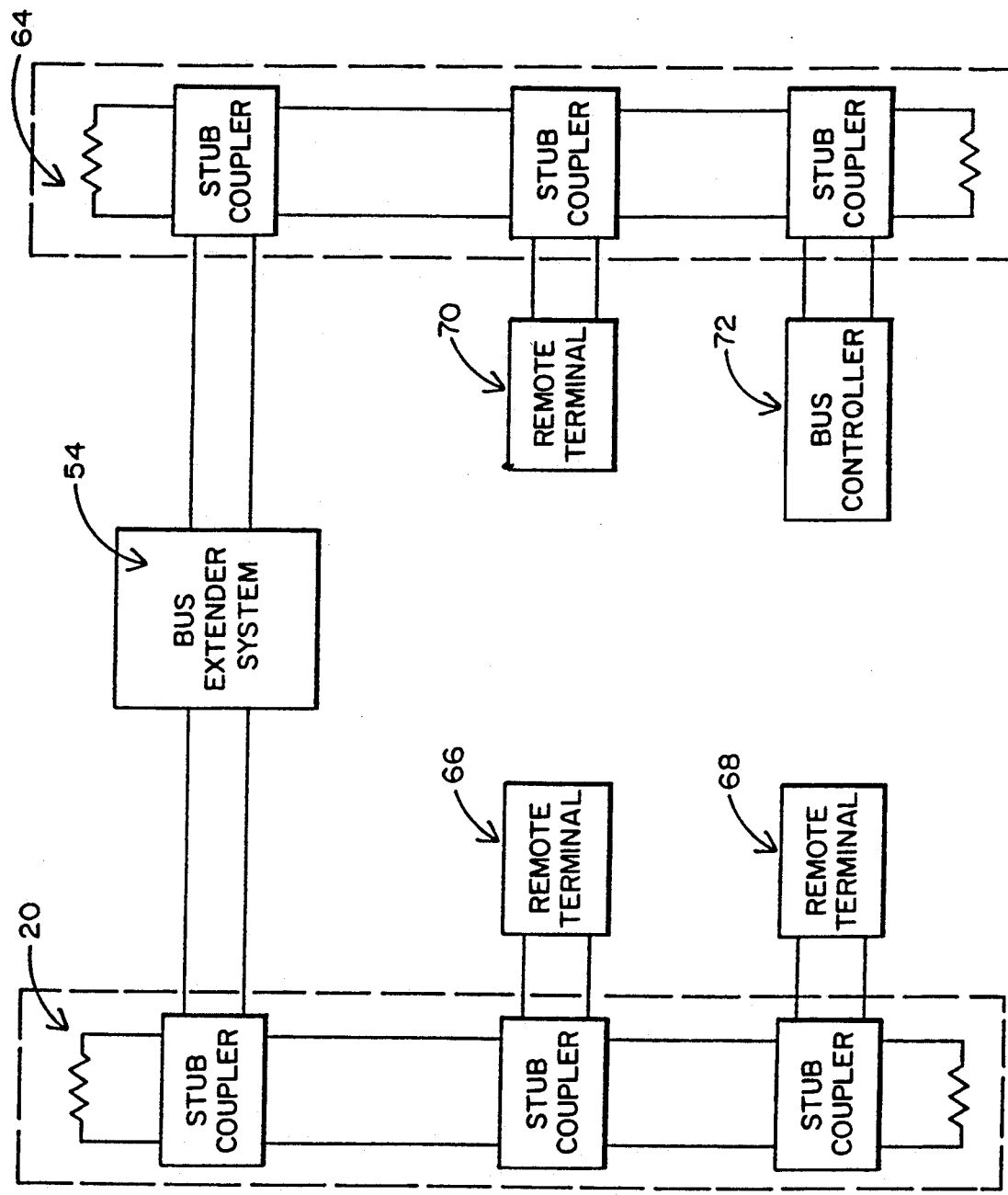
FIG. 2 is a variation of the system of FIG. 1.

In FIG. 2, a box 54 represents the entire bus extender system, comprising the first EOI unit 28, the second EOI unit 44, and the two fiber optic cables (which may extend 500 to 1,000 meters). FIG. 2 shows bus extender 54 connected between two multiple coupled buses 20 and 64. Bus 20 in this system may have two remote terminals 66 and 68; and bus 64 may have a remote terminal 70 and a bus controller 72.

It is clear that the potential system arrangements are numerous. The bus extender system is the vital sub-system which permits efficient off-bus transmission of signals.

Figure 3:
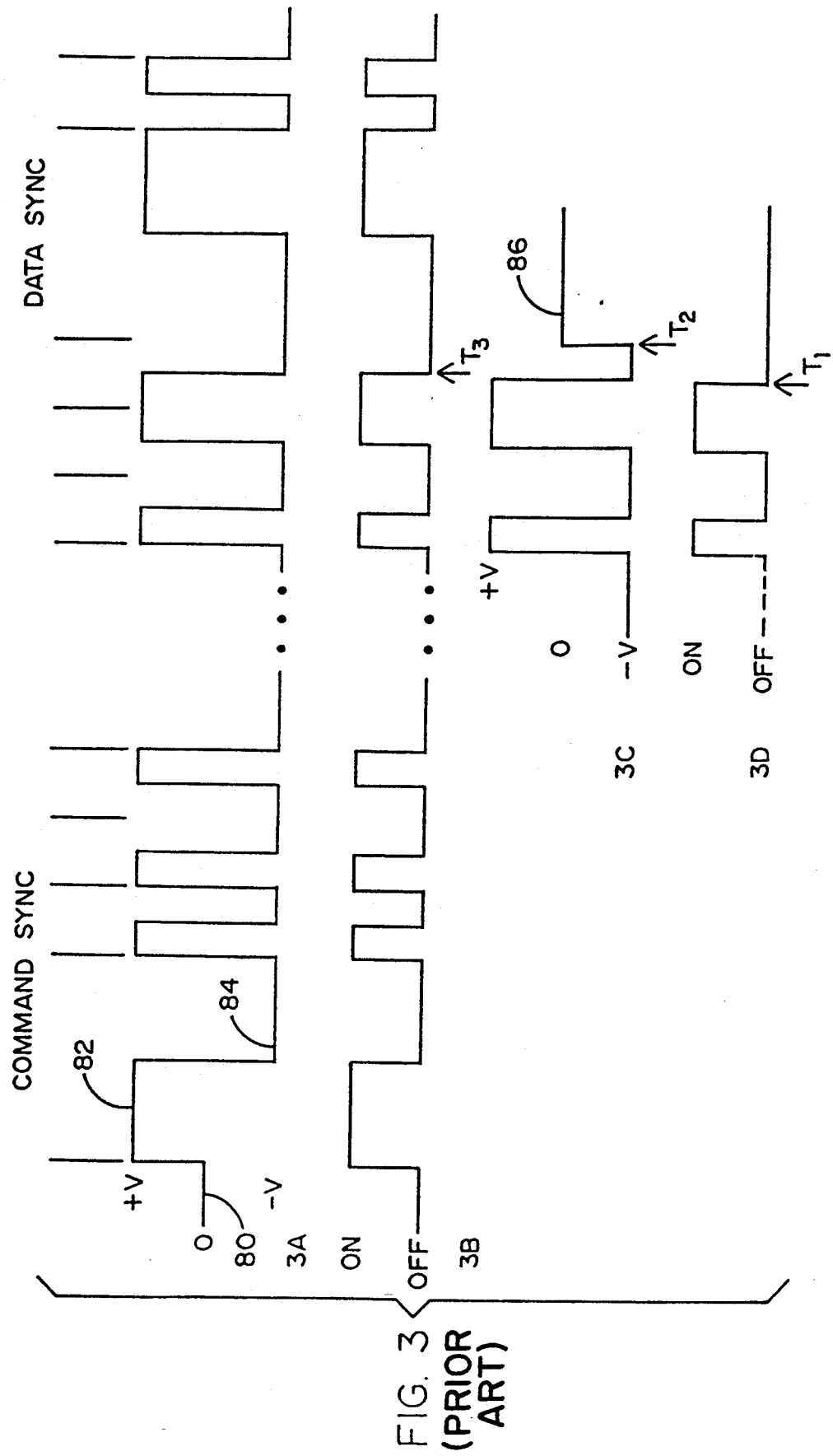
FIG. 3 shows a time diagram which illustrates the problem inherent in a fiber optic extender used with a standard data bus.

FIG. 3 shows a timing diagram which illustrates the problem in trying to use a fiber optic cable between two remote three level units. Line 3A shows the output electrical pulses. The zero V, plus V, and minus V levels are shown at the left. At the left end 80 of the voltage line, the value is zero. A plus voltage pulse is shown at 82, and a minus voltage pulse is shown at 84. Successive voltage pulse values fluctuate between the plus and minus levels. Line 3B shows the ON and OFF conditions of the optical signal on the fiber optic cable. The optical signal is off except when the voltage on line 3A is positive.

Line 3C shows the end of a three level electrical message, at which point the voltage level goes to zero, as shown by the right portion 86 of the line. As shown by line 3D, this change on line 3C is not registered by the two level optical signal. This zero voltage on line 3C is reached at time T2 The EOI must accurately determine the time T2 in the reconstructed bus signal when the message ends at T1. A further requirement is that T1 be distinguished from T3, where T3 is not the end of a message because a data sync follows the command word. Since the circuit must look ahead in time to determine whether a data word follows the end of the previous word, the transmitted message must be delayed by at least 1.5 microseconds.

Generally speaking, a timing problem exists because the encoding scheme of the bus cannot assume that no response is forthcoming until after a predetermined time. The time required to wait for a confirmed end-of-message (2 microseconds in the case of Mil-Std-1553) would be so long that it would interfere with the bus timing specification.

For reasons already discussed, the required delay is not acceptable in practical bus extender systems. One solution of the problem, which is believed to be in use, is the addition of a third fiber optic cable to overcome the ambiguity. However, such an arrangement is cumbersome and unnecessarily expensive. Another attempted solution involves bit counting techniques, which have significant error potential. Multiple wavelengths of light might be used, but the complications of such an approach would be unfavorable.

The goals are to encode three voltage states into a two state carrier, while maintaining maximum "transparency", to the encoding intervention. The required intervention is provided by an added electronic system, which provides the necessary end-of-message information without interfering with the normal operation of the communication system.

Figures 4, 5:
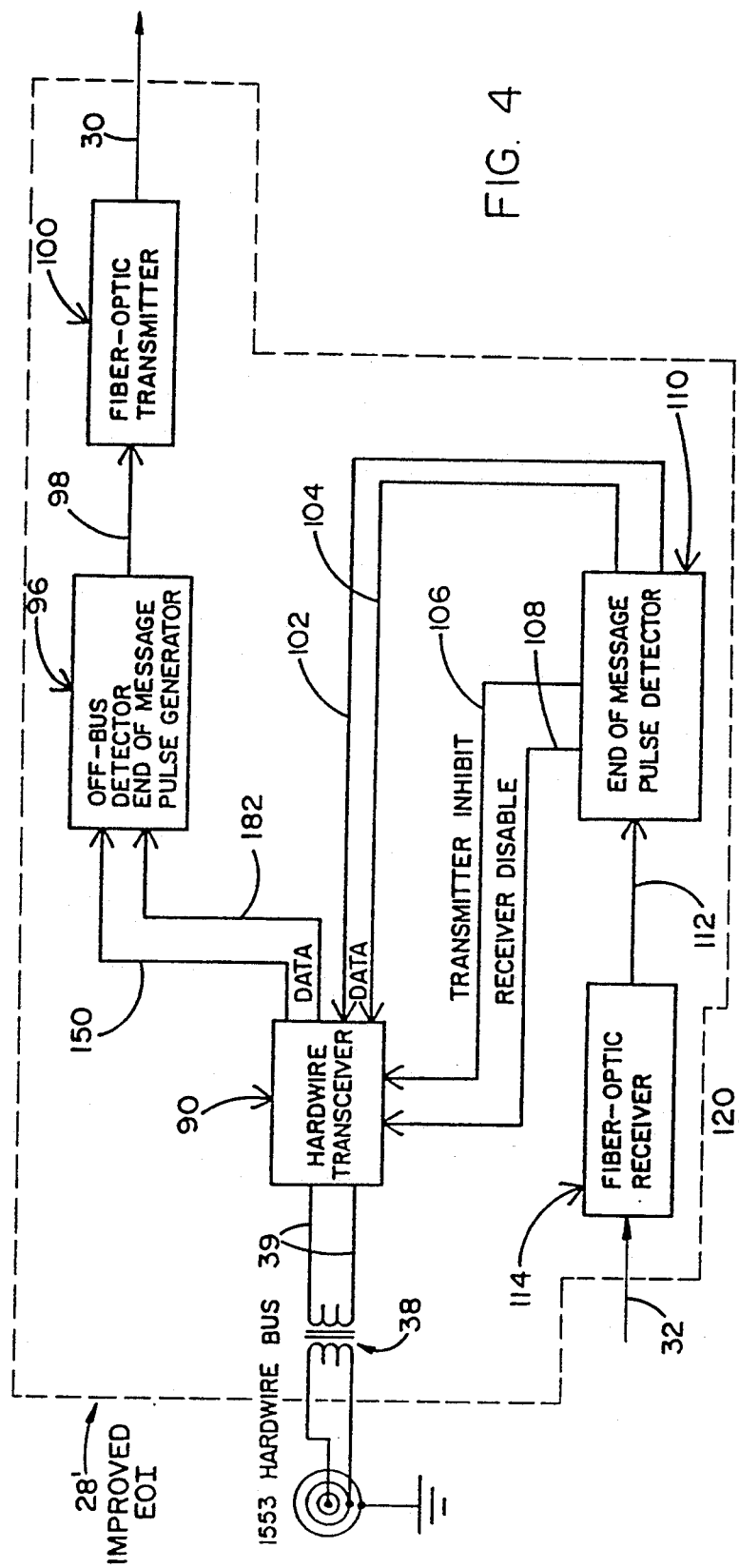

FIG. 4 shows the end-of-message elements diagrammatically. These elements are included in improved EOI units 28' or 44' (44' the same as 28') of the prior art systems shown in FIGS. 1 and 2. A hardwire transceiver 90 is responsible both for the conversion of electrical signals on winding 39 of transformer 38 to logic signals on output data lines 150 and 182, and for the conversion of logic signals on input lines 102 and 104 to electrical signals on winding 39. A similar transceiver (not shown) is included in the remote EOI unit.

As shown in FIG. 4, the output data lines 150 and 182 are connected to unit 96. Unit 96 has an output line 98 leading to a fiber optic transmitter 100. Transceiver 90 has four input lines—102, 104, 106 and 108—which are output lines from a receiving unit 110. Unit 110 has an input line 112 from fiber optic receiver 114.

The unit 96, which is replicated in the transmitter of the remote EOI, is an end-of-message pulse generator. The unit 110, which is also replicated in the receiver of the remote EOI, is an end-of-message pulse detector. The intercommunication, via the fiber optic lines, of units 96 and 110 is the means for conveying an end-of-message optical pulse, which substantially eliminates waiting time in the bus extender system, and thus eliminates the previously discussed performance problems of fiber optic bus extender systems. The end-of-message pulse is narrower than any pulse included in the bus protocol; so no confusion is possible.

FIG. 5 is a block diagram showing the basic elements of the unit 96. It comprises a data level comparator 120 and a pulse generator 122. Inputs A and B of comparator 120 receive, respectively, the logic signal on output data line 150 from the transceiver and the complement (opposite polarity) of that signal on output data line 182 i.e., logic and not-logic. In other words, at any instant during message transmission, a positive-going pulse is being received at one input, and a negative-going pulse is being received at the other input. The comparator 120 generates a pulse output on line 124 only when both inputs go to zero (the only time when the comparator inputs are equal). The zero value is the third voltage value available from the transformer (positive, negative, zero).

When an output pulse is sent on line 124, it signifies that the present message has ended. The pulse entering pulse generator 122 causes the latter to generate a short end of message signal, e.g., a signal having a pulse width of 100 nanoseconds (ns).

FIG. 6 is a block diagram showing the basic elements of the receiving unit 110. It includes an end-of-message discriminator 130. As long as a data bus message is being transmitted, the discriminator 130 sends it on line 132 to data driver 134. However, if an end-of-message signal from transmitter 96 is detected, a signal on line 136 to logic unit 138 causes an output signal on line 108 to disable the receiver, and causes an output signal on line 106 to prevent transmission of the end-of-message pulse by hardwire transceiver 90 to transformer 38.

FIG. 7 provides a more detailed showing of the electronic elements which create the end-of-message pulse from unit 96 (FIGS. 4 and 5). The electronic logic signal for the fiber optic transmitter 100 (FIG. 4) is carried by line 150 to one input 152 of a NOR gate 154. The output of NOR gate 154 is carried by line 156 to the fiber optic transmitter circuit after being inverter by inverter 157. The NOR gate 154 acts as a logic inverter.

The other input 158 of NOR gate 154 is connected to the output 160 of a one-shot (monostable multivibrator) 162, whose function is to generate a brief (100 ns) pulse when triggered. Triggering of one-shot 162 occurs when a negative-going edge is sensed on its input line 124.

An OR gate 166 will output a 1 value on line 168 as long as a given message is in progress on the bus extender. After passing through a delay device 170, the output signal of OR gate 166 reaches the input line 124 of one-shot 162. OR gate 166 has one input 172 which is connected to the output 174 of an OR gate 176. One input 178 of OR gate 176 is connected to logic line 150. The other input 180 of OR gate 176 is connected to not-logic line 182, which carries the complement of the logic value. In other words, whenever 10 the value at input 178 is high (1), the value at input 180 is low (0), and vice versa. This means that a 1 value will output from OR gate 176 on line 174 as long as message pulses are occurring. To provide a slight pulse overlap, thereby preventing an accidental loss of 1 value output while a message is being transmitted, a delay device 184 is connected between not-logic line 182 and input 186 of an OR gate 188. Another delay device 190 is connected between logic line 150 and input 192 of OR gate 188. This arrangement insures that the output signal from OR gate 188 on input line 194 of OR gate 166 will be slightly offset from the signal on its input line 172. Therefore, a 1 value will be maintained throughout the message transmission. The usefulness of the overlap feature is due to the differences in rise and fall times of the message pulses, depending on the amplitude of the incoming signals.

When both logic line 150 and not-logic line 182 drop to low (0), the end of message is indicated. At this time the output of OR gate 166 will drop to 0. This causes a negative-going pulse edge which triggers one-shot 162, causing it t generate its short end-of-message signal.

Since the value at input 152 of NOR gate 154 is 0, the positive pulse at input 158 will cause an inverted (0) signal on line 156. This signal is subsequently converted to 1 by inverter 157 on its way to the fiber optic transmitter 100 via output line 98.

Figure 8:
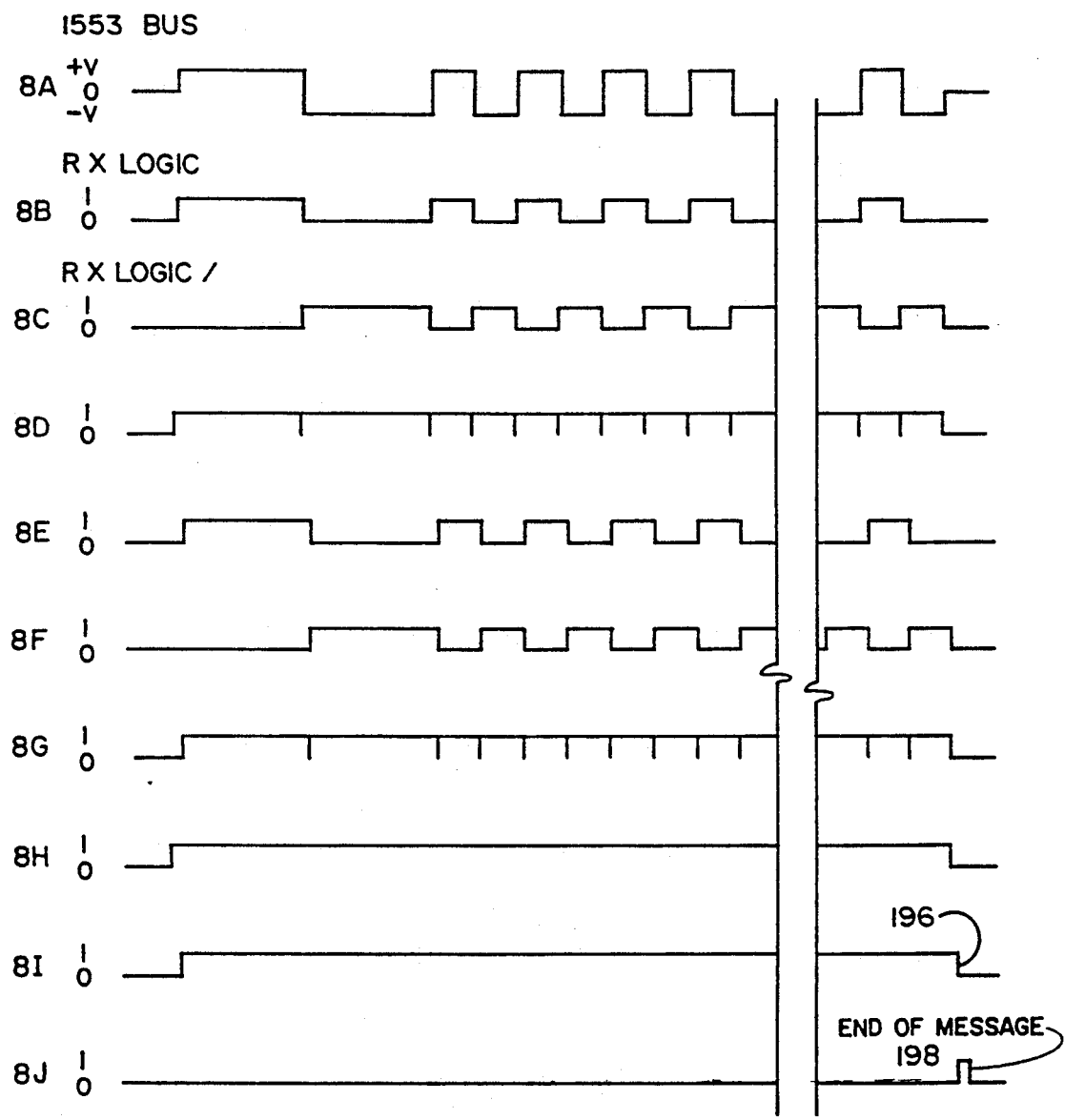

FIG. 8 is a time diagram illustrating the pulse timing at key points in the FIG. 7 circuitry. Line 8A shows pulses at the hardwire transceiver, prior to their conversion to two value (high/low) logic. Three values exist—plus voltage, zero voltage, and minus voltage. The first and last ends of the line are at zero voltage. The other portions change between positive and negative voltage.

After the EOI has converted the bus information to two value logic, the variations of voltage are between logic 1 and 0, as shown on subsequent lines of FIG. 8. The logic and not-logic values are shown, respectively, on lines 8B and 8C. These are the values present at inputs 178 and 180, respectively, of OR gate 176 (FIG. 7). The pulse forms on lines 8B and 8C are mirror images of one another.

Line 8D shows the pulse form at the output of OR gate 176. The value remains at 1, because one of the inputs is always at 1. Line 8E shows the slightly delayed pulse form exiting delay device 184 on line 186. Line 8F shows the slightly delayed pulse form exiting delay device 190 on line 192. The pulse forms on lines 8E and 8F are mirror images of one another, because one receives the logic input, and the other receives the not-logic input. Line 8G shows the pulse form at the output of OR gate 188. Like the output of OR gate 176, the value remains at 1, because of the logic and not-logic inputs. The pulse form on line 8G is delayed slightly from the pulse form on line 8D.

Line 8H shows the logic output from OR gate 166. The line stays high throughout the message being transmitted. It goes low when both logic and not-logic go low, indicating that the message has ended. Line 8I shows the output on line 124. Its profile essentially matches that of line 8H, except that 8I has been delayed slightly by the delay device 170.

Line 8J shows the output from one-shot 162 on line 160. The logic voltage remains at the low level until one-shot 162 is triggered by the negative-going pulse edge 196 (line 8I). Triggering of one-shot 162 causes it to output a short end-of-message pulse 198 (line 8J).

Figure 9:
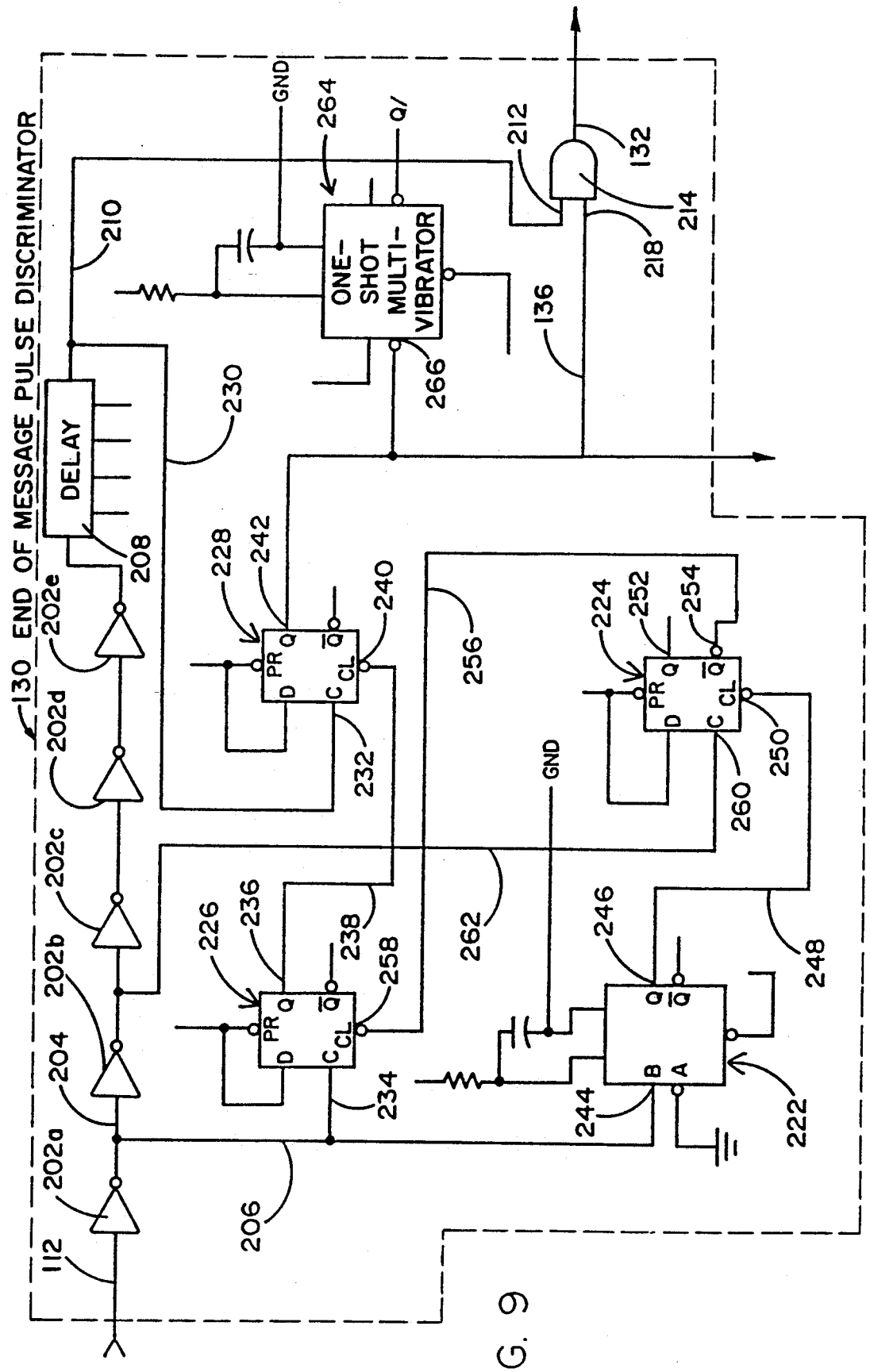

FIG. 9 shows the primary electronic components included in the end-of-message discriminator 130 associated with the fiber optic receiver. Receiving unit 110 (FIGS. 4 and 6) receives an electronic logic signal on line 112. That signal has been converted from the optical signal received by fiber optic receiver 114 (FIG. 4). After passing through an inverter 202a, a message pulse from the fiber optic extender has a positive-going edge on line 204 and on line 206. The normal message pulses pass through a series of inverters 202b, 202c, 202d, and 202e, and a delay device 208. Then they are output on line 210 to one input 212 of an AND gate 214. The output line 216 of AND gate 214 leads to the hardwire transceiver unit.

AND gate 214 is enabled to transmit the normal message information as long as its second input 218 has a 1 value provided by an enable line 136. The value on enable line 136 drops to 0 for a predetermined period in response to an end-of-message pulse on incoming line 200.

The circuitry in FIG. 9 has three primary functions. First, it delays the normal message pulses sufficiently to permit detection of the end-of-message pulse. The end-of-message pulse is preferably 100 nanoseconds (ns) wide. The minimum pulse width during a normal message transmission is 500 nanoseconds (ns). Delay device 208, and inverters 202b, 202c, 202d, and 202e, provide sufficient delay to permit detection of a 100 ns pulse before the normal message pulse is transmitted through AND gate 214.

The second and third functions of the FIG. 9 circuitry are detection of an end-of-message pulse, and removal of that pulse from the pulse train on line 132. Detection of the end-of-message pulse is primarily the function of a one-shot 222, which creates a "window" 300–400 nanoseconds wide. If no incoming pulse is completed within that period, the normal message passes through from line 112 to line 132, because the value on enable line 136 remains at 1. If, however, a shorter incoming pulse (end-of-message) is detected at one-shot 222, the result is a change at a flip-flop 224, which in turn causes a change at a flip-flop 226. The change at flip-flop 226 causes a change at a flip-flop 228, which changes the value on enable line 136 to 0, thereby blocking the message pulses on line 210 at AND gate 214. The subsequent return to 1 of the value on enable line 136 is accomplished by a signal carried on line 230 from line 210 to clock input 232 of flip-flop 228.

A more detailed explanation of the FIG. 9 circuitry can begin with the logic values when the system is at rest. In an off state, with no incoming signals, the value on line 206 is 0. So 0 is the value at clock input 234 of flip-flop 226; and the Q output 236 of flip-flop 226 is at 0. The 0 on line 238 is present at the clear input 240 of flip-flop 228, and holds the Q output at 242 at 0. This causes enable line 136 to be at 0. At one-shot 222, the value at input 244 is 0 and the Q output 246 is 0. This output is connected by line 248 to the clear input 250 of flip-flop 224, holding that flip-flop in clear condition. Therefore, its Q output 252 is 0, and its $\overline{Q}$ output 254 is 1. Line 256 connects output 254 to clear input 258 of flip-flop 226. Since the value at clear input 258 is 1, the clear constraint is removed. Therefore, a subsequent pulse leading edge can fire flip-flop 226.

When a positive-going edge from a message pulse appears on line 206, the signal at clock input 234 causes flip-flop 226 to fire. Because the clear control has been removed, this signal at 234 causes the Q value at 236 to go to 1. This 1 value is connected by line 238 to the clear input 240 of flip-flop 228, removing the clear constraint from flip-flop 228.

When a positive-going edge appears on line 230, it reaches input 232 of flip-flop 228, causing it to fire. This causes the Q value at 242 to go to 1. Enable line 136, therefore, has a 1 value, and thus permits message pulses on line 210 to permit any pulses to pass through AND gate 214 to output line 132.

Between line 206 and line 230, the signal has been delayed by somewhat more than 100 nanoseconds (e.g., 350 ns). Delay device 208 is a 350 ns delay, and the series of inverters 202 causes a slight additional delay (e.g., 20 ns). This permits a 100 ns end-of-message pulse to be detected.

The positive edge on line 206 causes the one-shot 222 to fire, i.e., a 1 value from Q output 246 is sent on line 248 to the clear input 250 of flip-flop 224. The period during which this 1 output at Q is maintained is the 300–400 nanoseconds for which the one-shot 22 is designed. During this period, the clear constraint on flip-flop 224 is removed. It will fire if a positive edge is received at its clock input 260. Such an edge will occur if an end-of-message pulse enters on line 200. If a 100 nanosecond pulse arrives, its negative-going edge will be changed to a positive-going edge by inverter 202b. This inverted positive edge will be carried by line 262 to input 260 of flip-flop 224, causing the flip-flop to fire. This changes the 1 value at $\overline{Q}$ output 254 to 0, and sets clear input 258 of flip-flop 226 to 0. This in turn takes Q output 236 of flip-flop 226 to 0, and also takes clear input 240 of flip-flop 228 to 0. As a result, Q output 242 of flip-flop 228, which controls the enable line 220, goes to 0. The AND gate 214 is disabled; and it does not permit any pulses to pass through, including the end-of-message pulse.

When the firing period of one-shot 222 ends (after 300–400 ns), its Q value at 246 returns to 0, and this value at clear input 250 of flip-flop 224 clears that flip-flop. Its $\overline{Q}$ output value at 254, therefore, becomes 1. This value, conveyed by line 256 to the clear input 258 of flip-flop 226 removes the clear constraint. Therefore, a subsequent positive-going pulse o line 206 can fire flip-flop 226. So the system is ready to start a new message. A new message will often be a response to, or acknowledgement of, the just concluded message.

A one-shot 264 is provided, which has its input 226 connected to enable line 220. One-shot 264 fires when the enable goes from an on condition to an off condition. It allows for propagation delays, in order to prevent problems due to differences in transition speeds from high to low or vice versa.

Figure 10:
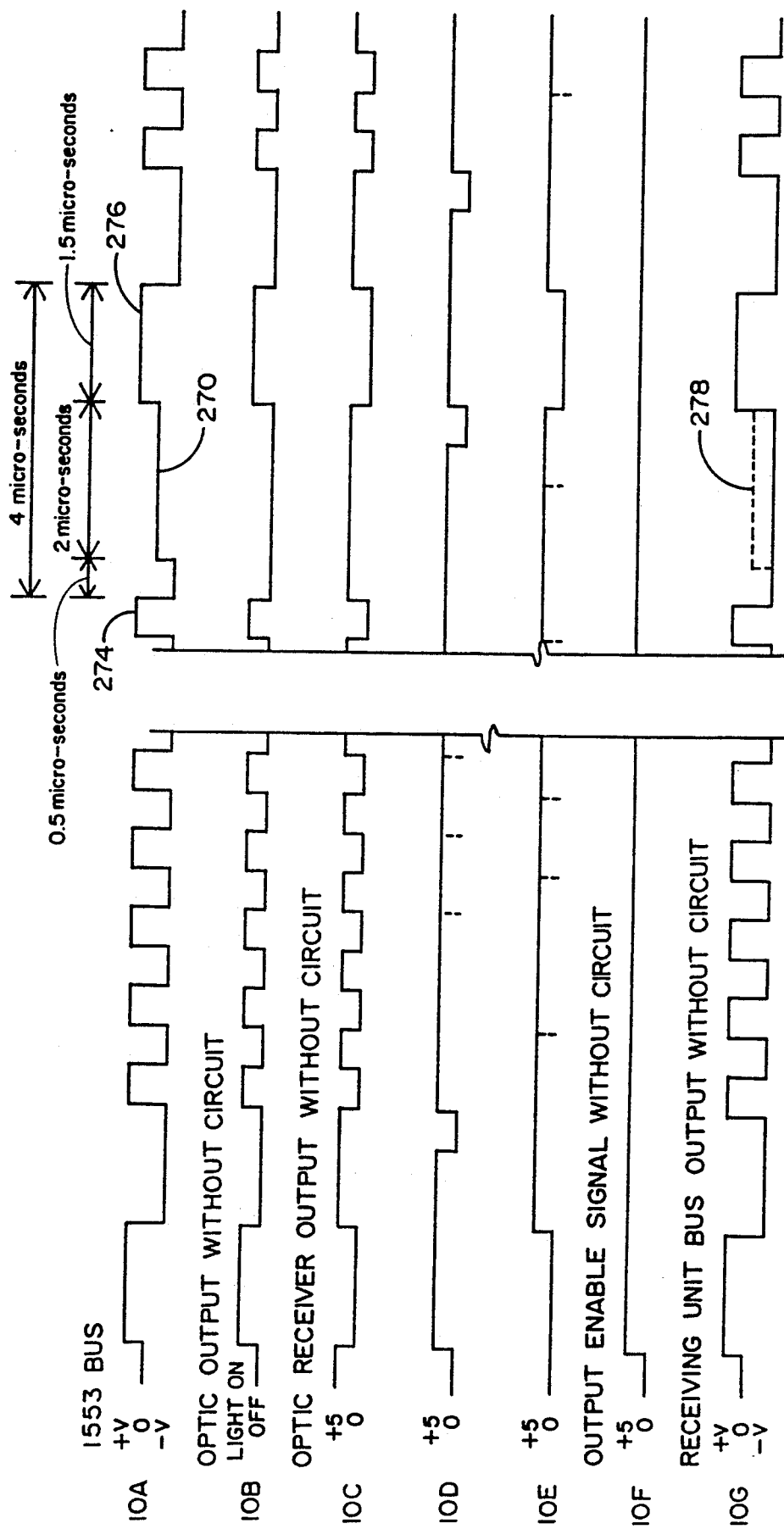

FIGS. 10 and 11 show graphically the improvement embodied in this invention. FIG. 10 illustrates the bus timing as it would be without the new circuit described herein. FIG. 11 illustrates the bus timing as implemented by this new circuit. In the process of developing this invention, the applicants first attempted to implement a design which would operate according to FIG. 10, before arriving at the final, unique design which operates according to FIG. 11.

In FIG. 10, line 10A shows pulses on the bus, before or after their conversion to high/low logic. Three values exist—positive voltage, zero voltage, and negative voltage. A zero voltage condition exists between messages, at line 270, indicating that a message has ended. The last pulse in the message occurred at 274. The total of 4 microseconds ($\mu s$) indicates how quickly a remote terminal can respond to a bus controller command. If a 4 $\mu s$ wait were incorporated, a new message would have begun with pulse 276, causing signal confusion and loss of synchronization.

Line 10B shows the optical pulses; and line 10C shows the voltage logic pulses from the optical receiver. Lines 10D and 10E show, respectively, the logic outputs from two flip-flops in the system. And line 10F shows that the combination of high values on lines 10D and 10E causes a continuous high value, which blocks out the dead (zero voltage) portion 270 in line 10A. The result is a failure to distinguish the end of one message and the start of a new message. Stated in another way, a timer was started and restarted on every edge of the incoming data. The duration of the timer was too long for those cases where a remote terminal would respond faster than the width of the timer. The EOI would not give up the bus connection soon enough. Line 10G shows the receiving unit bus output, having high, low, and zero values. The zero value (end-of-message) time, shown by dashed line 278, has not been recognized by the communication system.

FIG. 11 is a time diagram showing how the brief end-of-message pulse (FIGS. 4-9) solves the problem illustrated in FIG. 10. Line 11A represents the on/off optical transmitter output. The end of the present message occurs at 280; and the 100 ns pulse is generated at 282. Line 11B shows the logic pattern at the input of the optical receiver. It has the same pulse pattern as line 11A. Line 11C shows the enable pattern provided by the end-of-message detection electronics. The pulse flow is disabled during the low period 284. Line 11D shows the stripped signal at the receiver, after the end-of-message pulse 282 has been removed. Line 11E shows the three level signal values at the receiving transceiver. The receiver is off the bus at dashed line 286, and has a zero voltage value for a period 288 before a new data message starts at 290. In the system represented in FIG. 11, the time required to determine that a data message has ended is too short to cause loss of synchronization.

From the foregoing description, it will be apparent that the apparatus and method disclosed in this application will provide the significant functional benefits summarized in the introductory portion of the specification.

The following claims are intended not only to cover the specific embodiments and method disclosed, but also to cover the inventive concepts explained herein with the maximum breadth an comprehensiveness permitted by the prior art.

What is claimed is:

1. A combined electronic and optical communication system comprising:
   an electronic system for carrying various intercommunication signals within the system, the signals in said electronic system having three possible values designated first, second and third values;
   an optical message transmitting line having a local and remote end, said line for carrying two signal levels, on and off conditions of radiation on the line between the local and remote end;
   electro/optical converting means for changing the first and second values within the electronic system to optical pulses on the transmitting line local end; and
   a third value indicating means interconnected to the electronic system and the electro-optical converting means for sensing said third value and in response thereto (a) creating a third value pulse having a duration less than the duration of the optical pulses generated by the electro/optical converting means in response to electronic system first and second values, and (b) sending said third value pulse on the optical message transmitting line.

2. The combined electronic and optical communication system of claim 1 which also comprises:
   a second electronic system connected to the remote end of the optical message transmitting line; and
   discriminating means associated with said second electronic system for recognizing the significance of the third value pulse.

3. The combined electronic and optical communication system of claim 2 which comprises:
   means responsive to the discriminating means for enabling the optical message transmitting line to accept new messages from different sources.

4. The combined electronic and optical communication system of claim 2, which further comprises;
   means in the second electronic system for providing a signal delay window wider than the duration of the third value pulse.

5. An improved electro-optical bus extender for interconnecting first and second electrical systems which are remotely located from one another, wherein each electrical system provides a three-level electrical signal across first and second outputs, said three-level signal being positive voltage, a negative voltage or zero volt across said first and second outputs, wherein valid information units are represented by pulses having transitions from positive to negative voltage or from negative to positive voltage, wherein the duration for both the positive and negative portions of the shortest unit of valid information is a first predetermined length of time and wherein the duration of a second unit of information for both the positive and negative portions of the pulse is a second predetermined length of time greater than said first predetermined length of time, and wherein the start of a valid message is represented by a transition from zero to positive voltage, and wherein an end-of-message signal is represented by zero volts, further wherein the bus extender generates an ON signal if the electrical signal is positive and generates an OFF signal if the electrical signal is negative or zero, and further wherein the end-of-message signal as denotes by the electrical zero voltage must be determined at the second electrical system before expiration of a minimum response time for the second electrical system to respond to the first electrical system, the improved electro/optical extender comprising:

A) a first electro/optical interface unit (EOI) having means (38, 39) for connecting to the first and second outputs of the first electrical system and for generating (90) complimentary electrical logic signals on first and second data lines (150 and 182), said logic signals for the first data line being logic ON if the three-level voltage is positive and logic OFF if the three-level voltage is negative or zero, said logic signals for the second data line being logic OFF if the three-level voltage is positive, logic ON if the three-level signal is negative, and logic OFF if the three-level signal is zero; and further having an end-of-message pulse generator (96) for generating at an output an end-of-message logic ON signal having a pulse duration for a third predetermined length of time substantially less than said first predetermined length of time when the first and second data lines are both logic OFF, and for otherwise generating logic ON and logic OFF signals corresponding to the electrical logic signals on the first data line;

B) a fiber optical transmitter (100) connected to the output of the end-of-message pulse generator for generating an optical signal at an output which is ON or OFF so as to correspond to the output signals generated by the end-of-message pulse generator;

C) fiber optic means (30) having first and second ends, connected at the first end to the output of the fiber optic transmitter;

D) a second electro/optical interface unit (EOI) having a fiber-optic receiver (114) for connection to the second end of the fiber optic means for converting the ON and OFF optical signals into corresponding logic ON and logic OFF signals, and second EOI further comprising an end-of-message pulse detector (110) having means for detecting the optical end-of-message logic ON signal and for time delaying the logic ON and logic OFF signals at an output (132) thereof for a period of time greater than the third predetermined length of time but substantially less than the combination of the first and second predetermined length of time and further comprising means for detecting the presence of the end-of-message logic ON signal during a period of time less than said time delay, said end-of-message pulse detector further comprising means, in response to detection of the end-of-message logic ON signal for disabling the output of data after outputting the last unit of information preceding the end-of-message logic ON signal; the second EOI further comprising means connected to the output of the end-of-message pulse detector for generating the three-level electrical signal based upon the logic ON and logic OFF state of the data from the end-of-message pulse detector and for generating a zero voltage signal after detection of the end-of-message logic ON signal by the end-of-message pulse detector;

whereby the optically generated end-of-message ON signal is detected by the second EOI prior to a period of time the second EOI would otherwise have to wait so as to determine if no valid information has been received subsequent to presently received information and therefore wherein the second EOI is able to generate a zero voltage signal for the three level electrical signal without having to wait for an OFF signal to be detected for at least a length of time equal to the first predetermined length of time plus the second predetermined length of time.

6. An improved electro/optical bus extender as defined in claim 5, wherein the second EOI further comprises means in responses to the end-of-message logic ON signal for disabling the output of the end-of-message pulse detector (110) until detection of a new message occurs.

7. An improved electro/optical bus extender as defined in claim 5, wherein the fiber optic means comprises at least two optical fibers for interconnecting the first EOI to the second EOI and further wherein the first EOI includes a fiber optic receiver for connection to the second end of the second optical fiber for converting ON and OFF optical signal into corresponding logic ON and logic OFF signals, said first EOI further comprising an end-of-message pulse detector (110) having means for detecting an optical end-of-message logic ON signal and for time delaying the logic ON and logic OFF signals at an output (132) thereof for a period of time greater than the third predetermined length of time but substantially less than the combination of the first and second predetermined length of time further comprising means for detecting the presence of the end-of-message logic ON signal during a period of time less than said time delay, said end-of-message pulse detector further comprising means, in response to detection of the end-of-message logic ON signal for disabling the output of data after outputting the last unit of information preceding the end-of-message logic ON signal; and wherein the first EOI further comprises means connected to the output of the end-of-message pulse detector for generating the three-level electrical signal based upon the logic ON and logic OFF state of the signal from the end-of-message pulse detector and for generating a zero voltage after detection of the end-of-message logic ON signal by the end-of-message pulse detector;

and further wherein the second electro/optical interface unit (EOI) includes means for connecting to the first and second outputs of the second electrical system and for generating complimentary electrical logic signals on first and second data lines, said logic signals for the first data line being logic ON if the three-level voltage is positive, and logic OFF if the three-level voltage is negative or zero, and further having an end-of-message pulse generator (96) for generating at an output an end-of-message logic ON signal having a pulse duration for the third predetermined length, and for otherwise generating logic ON and logic OFF signals corresponding to the electrical logic signals on the first data line; wherein the first end of the second optical fiber is connected to the output of the second EOI pulse generator; whereby the improved electro/optical bus extender can communicate between the first and second EOI's in both directions.

8. An end-of-message pulse generator and an end-of-message pulse detector for use in an electro/optical transmission/reception system including at least one local transmitting station and one remote receiving station and a fiber optic means for interconnecting the stations to each other, wherein the electrical system comprises a three-level electrical signal having a positive or negative voltage with respect to first and second electrical outputs if a unit of information is on said outputs and a zero potential between said outputs if an end-of-message condition exists, the three-level electrical signal further using a protocol, wherein a valid information unit requires a polarity change between said two outputs from either a positive to a negative voltage, or vice versa, and wherein the duration of the positive voltage and the negative voltage is at least equal to a first predetermined length of time, and further wherein at least some units of information have a positive and negative voltage duration substantially longer than the last unit of information which can be generated in a valid message prior to generation of the zero voltage end-of-message signal, said longer duration of time designation as a second predetermined length of time, and further wherein said protocol requires a response time by a station within a third to fourth predetermined length of time, said third predetermined length of time greater than said second predetermined length of time, and further wherein each station includes a hardwire transceiver for controller receipt of said three-level signals so as to generate electrical logic ON and electrical logic OFF signals therefrom across first and second output data lines (150, 182), said electrical logic ON signal generated if a positive three-level electrical signal is detected and an electrical logic OFF signal is generated if a negative or zero three-level electrical signal is detected, and for controllable receipt of electrical logic ON and electrical logic OFF signals across first and second input data lines (102, 104) so as to generate said three-level electrical signals therefrom, and wherein each station further includes a fiber-optic transmitter for converting said electrical logic signals to corresponding optical ON and optical OFF signals for transmission on said fiber optic means and wherein each station further includes a fiber-optic receiver for receipt of optical ON and optical OFF signals from the fiber optic means and for converting said signals to corresponding electrical logic ON and electrical logic OFF signals; the improvement comprising an end-of-message pulse generator and an end-of-message pulse detector respectively interconnected between the hardwire transceiver and fiber/optic transmitter and the fiber/optic receiver and hardwire transceiver for the local and remote stations so as to respectively generate and detect a second type of end-of-message signal without waiting for a period of time to elapse equal to at least the combination of the first and second predetermined lengths of time, comprising:

A) an end-of-message pulse generator having means for receipt of the electrical logic ON and electrical logic OFF signals from the hardwire transceiver so as to generate corresponding output electrical signals for controlling the fiber/optic transmitter to generate corresponding optical ON and optical OFF signals if a three-level electrical signal end-of-message signal is not detected, said end-of-message pulse generator including means for determining when a three-level electrical signal end-of-message signal is present and for generating an electrical signal having a logic ON duration for a fifth predetermined length of time which is substantially less than said first predetermined length of time so as to command the fiber/optic transmitter to generate an optical ON signal with a corresponding duration; and B) an end-of-message pulse detector connected to the output of the fiber/optic receiver, said end-of-message pulse detector having means for delaying the electrical signals emanating at an output therefrom for a period of time greater than the fifth predetermined length of time and further having means for detecting the presence of the end-of-message optical signal faster than said time delay associated with said pulse detector so as to disable the output of the pulse detector after the last unit of information has been transferred to the transceiver but before the end-of-message signal reaches said output, and further generating a transmitter inhibit signal to cause the hardwire transceiver to generate a zero output voltage indicative of the three-level electrical signal end-of-message signal for the presently received information and for generation of a receiver disable signal when the transmitter inhibit signal is not enabled;

whereby the end-of-message pulse generator and end-of-message pulse detector in association with an electro/optical signal corresponding to the above protocol detects the three-level electrical signal end-of-message signal without requiring the remote portion of the electro/optical system to wait a length of time at least equal to the combination of the first and second predetermined length of time, thereby enabling the remote end of the electro/optical system to properly terminate an incoming message after receipt of the last unit of valid information much more rapidly than otherwise possible by use of transmitted optical ON and optical OFF signals.

9. An end-of-message pulse generator and an end-of-message pulse detector as defined in claim 8, wherein the end-of-message pulse detector further comprises means for maintaining the transmitter inhibit signal, once generated, until a different message is detected on the fiber optic means.

10. An improved method for electro/optical communication between first and second electrical systems which are remotely located from one another, wherein each electrical system provides a three-level electrical signal across first and second outputs, said three-level signal being a positive voltage, a negative voltage or zero volt across said first and second outputs, wherein valid information units are represented by pulses having transitions from positive to negative voltage or from negative to positive voltage, wherein the duration for both the positive and negative portions of the shortest unit of valid information is a first predetermined length of time and wherein the duration of a second unit of information for both the positive and negative portions of the pulse is a second predetermined length of time greater than said first predetermined length of time, and wherein the start of a valid message is represented by a transition from zero to positive voltage, and wherein an end-of-message signal is represented by zero volts, further wherein the bus extender generates an ON signal if the electrical signal is positive and generates an OFF signal if the electrical signal is negative or zero, and further wherein the end-of-message signal as denoted by the electrical zero voltage must be determined at the second electrical system before expiration of a minimum response time, wherein the improved method of electro/optical communication comprises the steps of:

A) connecting to the first and second outputs of the first electrical system and generating complimentary electrical logic signals on first and second data lines, said logic signals for the first data line being logic ON if the three-level voltage is positive and logic OFF if the three-level voltage is negative or zero, said logic signals for the second data line being logic OFF if the three-level voltage is positive, logic ON if the three-level signal is negative, and logic OFF if the three-level signal is zero;

B) generating at an output an end-of-message logic ON signal having a pulse duration for a third predetermined length of time substantially less than said first predetermined length of time when the first and second data lines are both logic OFF, and for otherwise generating logic ON and logic OFF signals corresponding to the electrical logic signals on the first data line;

C) generating an optical signal at an output which is ON or OFF so as to correspond to the output signals generated by the end-of-message pulse generator;

D) at the second electrical system, converting the ON and OFF optical signals into corresponding logic ON and logic OFF signals;

E) time delaying the logic ON and logic OFF signals at an output for a period of time greater than the third predetermined length of time but substantially less than the combination of the first and second predetermined length of time;

F) detecting the presence of the end-of-message logic ON signal during a period of time less than said time delay, and in response thereto disabling the output of data after outputting the last unit of information preceding the end-of-message logic ON signal; and G) generating the three-level electrical signal based upon the logic ON and logic OFF state of the data from the end-of-message pulse detector and further generating a zero voltage signal after detection of the end-of-message logic ON signal by the end-of-message pulse detector;

whereby the optically end-of-message ON signal is detected at the second electrical system prior to the period of time the second electrical system would otherwise have to wait so as to determine if no valid information has been received subsequent to the presently received information and therefore wherein the second electrical system is able to generate a zero voltage signal for the three-level electrical signal without having to wait for an OFF signal to be detected for at least a length of time equal to the first predetermined length of time plus the second predetermined length of time.

* * * * *

UNITED STATES PATENT AND TRADEMARK OFFICE
CERTIFICATE OF CORRECTION

PATENT NO. : 5,272,558

DATED : December 21, 1993

INVENTOR(S) : Michael Canestri, Ross D. Capen and Kevin F. Keefe

It is certified that error appears in the above-identified patent and that said Letters Patent is hereby corrected as shown below:

At column 3, line 11, after "40", please delete "o" and substitute therefor --on--.

At column 3, line 21, please delete "bipolar" and substitute therefor --bi-polar--.

At column 5, line 45, after "whenever", please delete "10".

Column 5, line 68, delete "t" and substitute therefor --to--.

Signed and Sealed this

Fourteenth Day of June, 1994

Attest:

BRUCE LEHMAN

*Attesting Officer*  *Commissioner of Patents and Trademarks*